United States Patent [19]
Han

[11] Patent Number: 5,682,351
[45] Date of Patent: Oct. 28, 1997

[54] SEMICONDUCTOR MEMORY DEVICE HAVING AN INTERNAL COPY FUNCTION

[75] Inventor: Kyu-Han Han, Seoul, Rep. of Korea

[73] Assignee: Samsung Electronics Co., Ltd., Suwon, Rep. of Korea

[21] Appl. No.: 680,572

[22] Filed: Jul. 12, 1996

[30] Foreign Application Priority Data

Jul. 12, 1995 [KR] Rep. of Korea ............. 95-20506

[51] Int. Cl.$^6$ .................. G11C 7/00; G11C 8/00
[52] U.S. Cl. .................. 365/189.05; 365/230.01; 365/230.08; 365/205
[58] Field of Search .............. 365/189.05, 230.01, 365/230.08, 205

[56] References Cited

U.S. PATENT DOCUMENTS 5,291,442  3/1994  Emma et al. ............. 365/230.01

*Primary Examiner*—David C. Nelms
*Assistant Examiner*—Trong Quang Phan
*Attorney, Agent, or Firm*—Marger, Johnson, McCollom & Stolowitz, P.C.

[57] ABSTRACT

A semiconductor memory device having an internal copy function. The memory device includes a memory cell array composed of a plurality of memory cells coupled to a plurality of bit lines, a plurality of column selectors coupled between the bit lines and an input/output data line for being turned on in response to a column select signal, a data amplifying circuit coupled to the input/output data line for amplifying the readout data, a data storage for receiving and latching the amplified data, and a write driver for outputting the latched data to the input/output data line.

5 Claims, 2 Drawing Sheets

SEMICONDUCTOR MEMORY DEVICE HAVING AN INTERNAL COPY FUNCTION

BACKGROUND OF THE INVENTION

1. Field of the Invention

The present invention relates to a semiconductor memory device having an internal copy function, and more particularly to a semiconductor memory device which can copy data stored in a source region in a memory cell array into an object region therein.

2. Description of the Prior Art

Typically, in order to store data in a specific region in a memory cell array, a word line in the memory cell is first activated by inputting an X-Y address for storing the data (wherein "X" is a row address and "Y" is a column address), and simultaneously a column select transistor which is coupled between a pair of bit lines BLi and a pair of input/output lines IOi is turned on. Thereafter, if the data to be stored is inputted to a data input pad, the input data is then supplied to the pair of bit lines BLi via the pair of input/output lines IOi and the column select transistor, resulting in that the data is stored in a corresponding memory cell.

FIG. 1 is a schematic circuit diagram of a conventional memory device. In FIG. 1, the reference numeral MCA denotes a memory cell array having a plurality of memory cells each of which is coupled to a pair of bit lines BLi (which is composed of a bit line BL and a complementary bit line BLB). Also, the reference numerals CSLGi and $CSLG_{i+1}$ denote pairs of column select transistors coupled between the pairs of bit lines BLi and $BL_{i+1}$ in the memory cell array MCA and the pair of input/output lines IOi, respectively.

At one side of the pairs of column select transistors CSLGi and $CSLG_{i+1}$, a data amplifying circuit for amplifying data on the pair of input/output lines IOi, i.e., an input/output line sense amplifier IOSA is provided, and the data amplifying circuit IOSA is coupled to a data output buffer DOB. Also, between the pair of input/output lines IOi and a data input pad DIN for inputting external data, an input buffer DIB for buffering the input data and a write driver WRDRV for driving the output of the input buffer DIB to the pair of input/output lines IOi are coupled.

In the semiconductor memory device having the above-described construction, a complicated read and write process should be performed to transfer the data stored in a source region of a specific X-Y or Xi-Yi address (wherein "i" denotes a natural number) to an object region of another X1-Y1 or Xy-Yy address (wherein "1" and "y" denote natural numbers and 1≠i≠y). For example, in the event that the data to be stored in the address of the object region has already been stored in the address of the source region, a read cycle for outputting the data and a storage cycle for storing the outputted data in the memory cell array should be repeatedly performed i times for each address. Such a repeated operation will be explained in detail with reference to FIG. 1.

When the data read out from the memory cell array is transmitted to the pair of input/output lines IOi through the pair of column select transistors CSLGi, the data is amplified by the data amplifying circuit IOSA and then transmitted to the data output buffer DOB. At this time, the pair of column select transistors CSLGi are switched in response to an output of a column decoder (not illustrated) which activates the column select line CSL by decoding the column address. The data output buffer DOB outputs through a data output pad DOUT the data provided from the data amplifying circuit IOSA.

In order to store the data outputted from the memory cell array as described above in an objective address, for example, in a memory cell which is connected to the pair of bit lines $BL_{i+1}$ coupled to the pair of column select transistors $CSLG_{i+1}$, the data from the data output pad DOUT is inputted to the input buffer DIB through the data input pad DIN. The data input buffer DIB converts the input data of a TTL level to a signal of a CMOS level, and provides the converted data to the write driver WRDRV. The write driver WRDRV transmits the input data to the pair of input/output lines IOi. The input data of the pair of input/output lines IOi is then transmitted to the pair of column select transistors $CSLG_{i+1}$. At this time, since the pair of column select transistors $CSLG_{i+1}$ are turned on by the output of the column decoder which decodes the objective column address and outputs the decoded address, the input data is stored in the corresponding objective address of the memory cell.

As a result, in the data output and input process according to the conventional semiconductor memory device as described above, data protection with respect to the data output path, the external interface, and the data input path is required since the data error is frequently generated with respect to the input/output data. Specifically, in the event that the data stored in the memory cell array chip is restored in an object address of the same memory cell array chip, the data should passes through the output path-external interface-input path. This causes the error to be easily generated, making the safe copy of data in the same memory device chip difficult. Further, in the event that a succession of data stored in a plurality of addresses (on the basis of column addresses) are copied into another plurality of addresses in sequence, data readout/data write cycles of i times are required, causing a high-speed copy to be impossible.

SUMMARY OF THE INVENTION

It is an object of the present invention to provide a semiconductor memory device having an internal copy function which serves to access data in a source address in a memory chip and to restore the accessed data in an object address in the same chip.

It is another object of the present invention to provide a semiconductor memory device having an internal copy function which can improve the data stability and data transmission efficacy, and thus enables a high-speed operation by reducing the number of read and write cycles when a plurality of data are read out from source addresses in a memory cell array chip and then the readout data are restored in object addresses in the same memory cell array chip.

In one aspect of the present invention, there is provided a semiconductor memory device having an internal copy function comprising: a memory cell array composed of a plurality of memory cells coupled to a plurality of bit lines; a plurality of column select means, coupled between said plurality of bit lines and an input/output data line, respectively, for being turned on in response to a column select signal; data amplifying means, coupled to said input/output data line, for amplifying data read out from said memory cell array; data storage means for receiving and latching said data amplified by said data amplifying means; and write drive means for providing said data latched in said data storage means to said input/output data line.

In another aspect of the present invention, there is provided a semiconductor memory device having an internal copy function comprising: a plurality of memory cell arrays respectively composed of a plurality of memory cells coupled to a plurality of bit lines; a plurality of input/output data lines; a plurality of column select means, coupled between said plurality of bit lines and said plurality of input/output data lines, respectively, for being turned on in response to corresponding column select signals; a plurality of data amplifying means, coupled to said plurality of input/output data lines, respectively, for amplifying data read out from said plurality of memory cells; a plurality of data storage means for receiving and latching said data amplified by said plurality of data amplifying means; and a plurality of write drive means for providing said data latched in said plurality of data storage means to said plurality of input/output data lines, respectively.

BRIEF DESCRIPTION OF THE DRAWINGS

The above objects, other features and advantages of the present invention will become more apparent by describing the preferred embodiments thereof with reference to the accompanying drawings, in which.

DETAILED DESCRIPTION OF THE PREFERRED EMBODIMENTS

Figure 1:
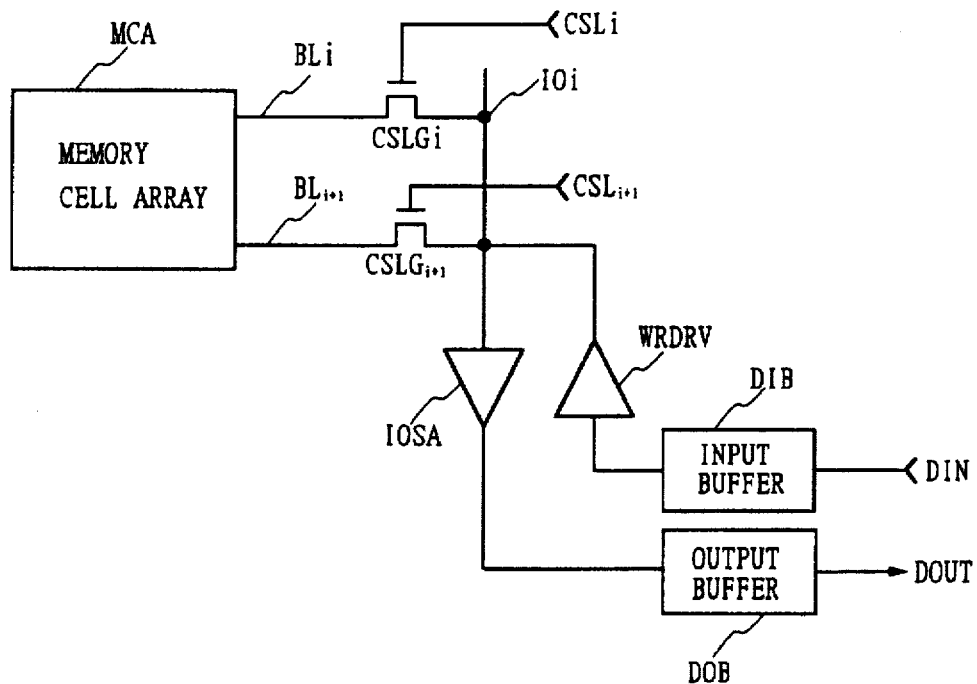
FIG. 1 is a schematic circuit diagram explaining the data input/output operation of a conventional semiconductor memory device.
Figure 2:
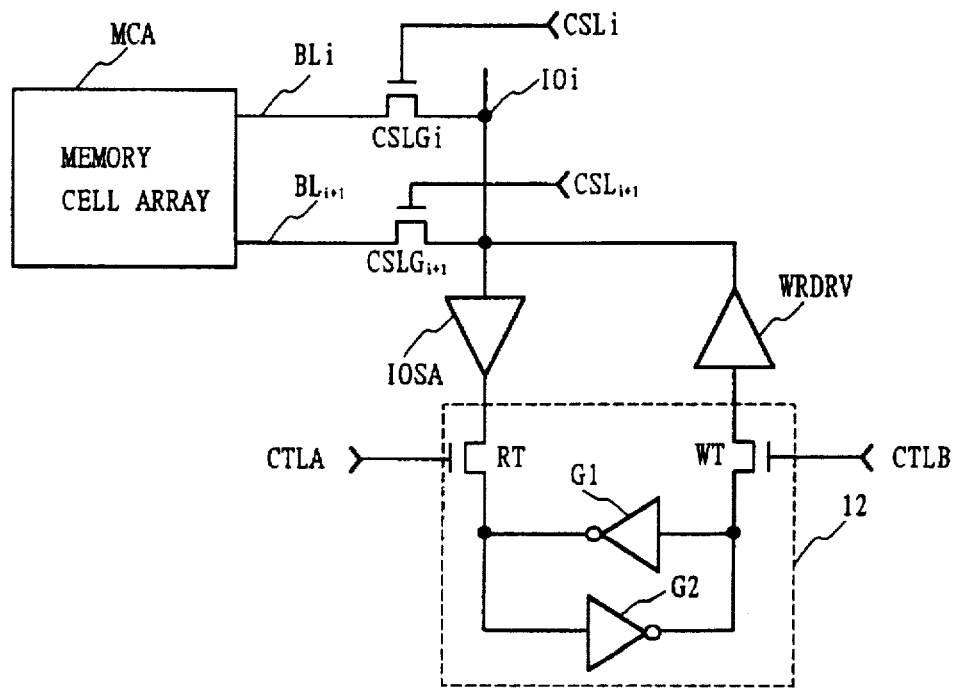
FIG. 2 is a schematic circuit diagram illustrating the construction of the semiconductor memory device having an internal copy function according to the present invention.

FIG. 2 is a schematic circuit diagram showing the construction of the semiconductor memory device having an internal copy function according to the present invention. In FIG. 2, the same components as those in FIG. 1 are represented by the same reference numerals.

The semiconductor memory device of FIG. 2 comprises data storage means 12 which latches the output of the data amplifying circuit IOSA in response to the activity of a first control signal CTLA, and transmits the latched data to the data transmission circuit, i.e., the write driver WRDRV in response to the activity of a second control signal CTLB, in addition to the construction of FIG. 1.

The data storage means comprises a latch circuit composed of two inverters G1 and G2 coupled to each other in a latch form for storing input data, an input switching transistor RT for transmitting the output of the input/output amplifying circuit IOSA to the latch circuit in response to the input of the first control signal CTLA, and an output switching transistor WT for transmitting the latched data to the write driver WRDRV in response to the input of the second control signal CTLB. Here, the first control signal CTLA is activated when the data stored in the memory cell array MCA is read out, and the second control signal CTLB is activated when the data is written in the memory cell array MCA.

The circuit of FIG. 2 according to the present invention presents one embodiment wherein data paths are provided inside the chip to prevent data errors which may be generated due to the external interface. In explaining the embodiment of the present invention, it is presumed that the data to be stored in an object address, for example, in the column address $CSL_{i+1}$ (on the basis of the column address signal), has already been stored in the column address CSLi.

If a column address signal is inputted in a state that a specific word line in the memory cell array MCA is activated by the input of a row address signal, the column select line CSLi is activated by the operation of the column decoder (not illustrated).

At this time, due to the activation of the column select line CSLi, the pair of column select transistors CSLGi are turned on. Accordingly, the data in the memory cell array MCA is transmitted to the pair of input/output lines IOi through the bit line BLi and the column select gate CSLGi.

The data transmitted to the pair of input/output lines IOi is sense-amplified by the data amplifying circuit IOSA, and then inputted to the drain of the input switching transistor RT in the data storage means 12. At this time, if the first control signal CTLA, which is activated in a read mode, is inputted to the gate of the input switching transistor RT, the output data of the data amplifying circuit IOSA is stored in the latch circuit. The data which is read out from the memory cell array MCA as described above is then stored in the latch in the data storage means 12.

In this state, if the objective address is inputted and the second control signal CTLB is activated, the output switching transistor WT in the data storage means 12 is turned on. Accordingly, the data latched in the latch circuit is inputted to the write driver WRDRV through the channel of the output switching transistor WT. The write driver WRDRV transmits the data inputted through the output switching transistor WT to the pair of input/output lines IOi. At this time, if it is presumed that the column select line $CSLG_{i+1}$ is activated by the column decoder in accordance with the input of the objective column address, only the column select transistor $CSLG_{i+1}$ among the column select transistors CSLGi and $CSLG_{i+1}$ coupled to the pair of input/output lines IOi is turned on, so that the data through the write driver WRDRV is stored in the memory cell coupled to the bit line $BL_{i+1}$.

Consequently, restorage of the data stored in a certain address in the memory cell array MCA into an objective address can be effected without the necessity of the external interface.

Meanwhile, in the event that a plurality of data are accessed from the memory cell array MCA and the accessed data are stored in specific addresses in the memory cell array MCA, complicated data output/data input cycles have been required. However, according to another embodiment of the present invention, which will now be explained below, the number of data output/data input cycles can be greatly reduced.

In this embodiment, in order to simultaneously transmitting a succession of data as many as n, column select transistors CSLGn the number of which corresponds to the respective addresses, input/output lines corresponding to the column select transistors CSLGn, corresponding data amplifying circuits, write drivers, and data storage means are provided.

A succession of n data read out from the memory cell array MCA are transmitted to the pairs of input/output lines 10n through the column select transistors CSLGn, and the transmitted data are latched in the data storage means via data amplifying circuits IOSAn. Also, the transmission of n data from the data transmission means to the memory cell array MCA is simultaneously performed. As a result, according to the present invention, the number of the data read/write cycles can be reduced from n×2 times to two times.

Figure 3:
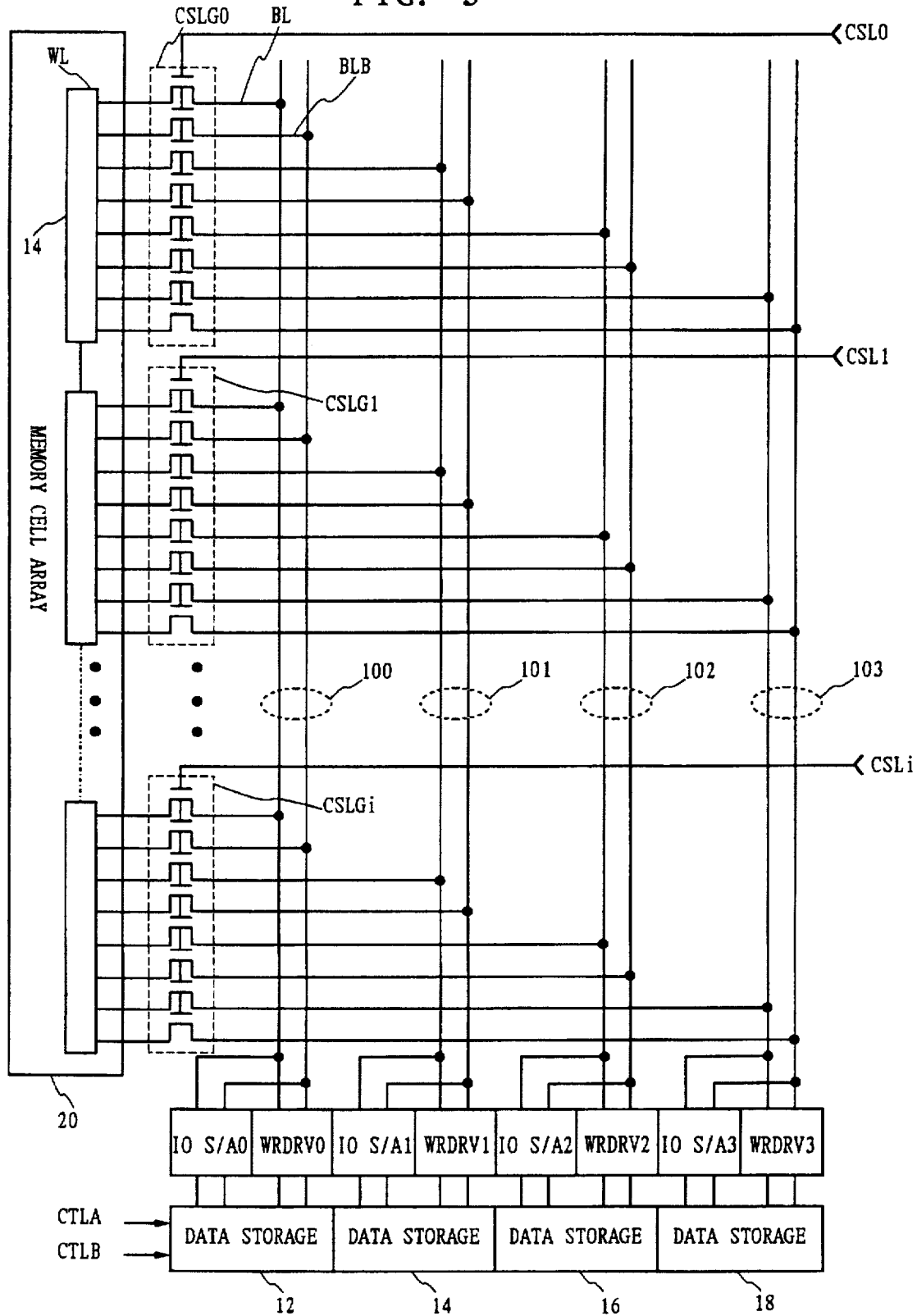
FIG. 3 is a detailed circuit diagram of the semiconductor memory device having an internal copy function according to a preferred embodiment of the present invention.

FIG. 3 shows the semiconductor memory device incorporating the data input/output control circuit of FIG. 2 according to the embodiment of the present invention. According to the construction of FIG. 3, the data transfer function whereby a 4-bit data as a basic unit is inputted and outputted is implemented utilizing the circuit construction of FIG. 2.

Specifically, the 4-bit data, which is selected by an external input signal, is read out from a 4-bit cell 20 in the memory cell array MCA, and is outputted to the pairs of input/output lines IO0 to IOn by means of the column select transistors CSLGn (wherein n denotes natural numbers, i.e.,0, 1, 2 ... n). The outputted data is amplified by the data amplifying circuits IOSA0 to IOSA3 and the amplified data is then stored in data storages 12 to 18 by the first control signal CTLA. The data stored in the data storages 12 to 18 is accessed by the second control signal CTLB, amplified with a predetermined level by the write drivers WRDRV0 to WRDRV3 coupled to the respective output terminals of the data storages, and then outputted to the input/output lines IO0 to IO3. The outputted data is then stored in another 4-bit cell in the memory cell array MCA through the column select transistors CSLGn which have been turned on by the selected column select lines CSLn.

From the foregoing, it will be apparent that the present invention provides the advantages in that the data in certain addresses in the memory cell array chip is copied into object addresses in the same memory cell array chip without external interface, and thus the generation of data errors can be prevented. Also, the data output/input cycles can be minimized, thereby effecting a high-speed copy function.

While the present invention has been described and illustrated herein with reference to the preferred embodiments thereof, it will be understood by those skilled in the art that various changes in form and details may be made therein without departing from the spirit and scope of the invention.

What is claimed is:

1. A semiconductor memory device having an internal copy function comprising:

a memory cell array composed of a plurality of memory cells coupled to a plurality of bit lines;

a plurality of column select means, coupled between said plurality of bit lines and an input/output data line, respectively, for being turned on in response to a column select signal;

data amplifying means, coupled to said input/output data line, for amplifying data read out from said memory cell array;

data storage means for receiving and latching said data amplified by said data amplifying means; and write drive means for providing said data latched in said data storage means to said input/output data line.

2. A semiconductor memory device as claimed in claim 1, wherein said data storage means comprises:

a latch circuit for storing said data inputted thereto;

an input switching transistor, coupled between said data amplifying means and an input of said latch circuit, for being switched in response to a first control signal; and an output switching transistor, coupled between said output of said latch circuit and said write drive means, for being switched in response to a second control signal.

3. A semiconductor memory device as claimed in claim 2, wherein said first control signal is activated when said data is read out from said memory cell array in an internal copy mode.

4. A semiconductor memory device as claimed in claim 2, wherein said second control signal is activated when said data is written in said memory cell array in an internal copy mode.

5. A semiconductor memory device having an internal copy function comprising:

a plurality of memory cell arrays respectively composed of a plurality of memory cells coupled to a plurality of bit lines;

a plurality of input/output data lines;

a plurality of column select means, coupled between said plurality of bit lines and said plurality of input/output data lines, respectively, for being turned on in response to corresponding column select signals;

a plurality of data amplifying means, coupled to said plurality of input/output data lines, respectively, for amplifying data read out from said plurality of memory cells;

a plurality of data storage means for receiving and latching said data amplified by said plurality of data amplifying means; and a plurality of write drive means for providing said data latched in said plurality of data storage means to said plurality of input/output data lines, respectively.

* * * * *